(12) United States Patent
Pikovsky

(10) Patent No.: US 9,554,486 B2
(45) Date of Patent: Jan. 24, 2017

(54) HEAT DISSIPATION SYSTEM

(71) Applicant: LTX-Credence Corporation, Norwood, MA (US)

(72) Inventor: Anatoly Pikovsky, Sharon, MA (US)

(73) Assignee: Xcerra Corporation, Norwood, MA (US)

( * ) Notice: Subject to any disclaimer, the term of this patent is extended or adjusted under 35 U.S.C. 154(b) by 102 days.

(21) Appl. No.: 14/185,664

(22) Filed: Feb. 20, 2014

(65) Prior Publication Data
US 2014/0238647 A1    Aug. 28, 2014

Related U.S. Application Data

(60) Provisional application No. 61/768,009, filed on Feb. 22, 2013.

(51) Int. Cl.
*H05K 7/20* (2006.01)
*G06F 1/20* (2006.01)

(52) U.S. Cl.
CPC .......... *H05K 7/20154* (2013.01); *G06F 1/20* (2013.01)

(58) Field of Classification Search
CPC .............................. H05K 7/20154; G06F 1/20
See application file for complete search history.

(56) References Cited

U.S. PATENT DOCUMENTS

| | | | | |
|---|---|---|---|---|
| 5,691,635 A * | 11/1997 | Pot | ............................ | G01D 3/02 324/115 |
| 6,744,640 B2 * | 6/2004 | Reis | ...................... | H01L 23/552 174/383 |
| 6,765,794 B1 * | 7/2004 | Inoue | ...................... | H01L 23/427 165/80.3 |
| 7,457,126 B2 * | 11/2008 | Ahrens | ................ | G02B 6/4292 257/E23.088 |
| 7,802,929 B2 * | 9/2010 | Moore | ................. | G02B 6/4201 385/88 |
| 7,965,514 B2 * | 6/2011 | Hill | ....................... | H04M 1/0277 361/679.54 |
| 7,974,098 B2 * | 7/2011 | Oki | ....................... | G02B 6/4201 165/185 |
| 8,081,470 B2 * | 12/2011 | Oki | ....................... | G02B 6/4201 165/185 |
| 8,477,499 B2 * | 7/2013 | Hill | ......................... | G06F 1/203 361/704 |
| 8,714,839 B2 * | 5/2014 | Ito | ......................... | H05K 9/0018 385/139 |
| 8,988,896 B2 * | 3/2015 | Wittmer | ............... | H05K 7/1462 174/350 |
| 2003/0224186 A1 * | 12/2003 | Feng | ....................... | C08L 83/04 428/447 |
| 2004/0052064 A1 * | 3/2004 | Oliver | ................. | H01L 23/4093 361/816 |
| 2005/0128710 A1 * | 6/2005 | Beitelmal | ................. | G06F 1/20 361/709 |
| 2007/0064387 A1 * | 3/2007 | Matsumoto | ........ | H05K 7/20154 361/690 |
| 2007/0210082 A1 * | 9/2007 | English | ................ | H05K 9/0032 220/4.21 |

(Continued)

*Primary Examiner* — David M Sinclair
*Assistant Examiner* — Robert Brown
(74) *Attorney, Agent, or Firm* — Brian J. Colandreo; Michael T. Abramson; Holland & Knight LLP

(57) ABSTRACT

An electronic component includes a component enclosure. At least one subcomponent is positioned within the component enclosure. The at least one subcomponent is configured to be thermally coupled to the component enclosure.

9 Claims, 3 Drawing Sheets

(56) References Cited

U.S. PATENT DOCUMENTS

| | | | | |
|---|---|---|---|---|
| 2009/0284918 | A1* | 11/2009 | Chou | G06F 1/182 361/695 |
| 2010/0085710 | A1* | 4/2010 | Bopp | B64D 43/00 361/697 |
| 2010/0245179 | A1* | 9/2010 | Puzella | H01Q 1/02 343/702 |
| 2010/0309631 | A1* | 12/2010 | Hill | H04M 1/0277 361/705 |
| 2011/0176279 | A1* | 7/2011 | Zhao | H01L 21/4878 361/720 |
| 2011/0242764 | A1* | 10/2011 | Hill | G06F 1/203 361/705 |
| 2012/0281360 | A1* | 11/2012 | Nicol | H05K 7/20127 361/704 |
| 2012/0281361 | A1* | 11/2012 | Gunderson | H05K 5/0256 361/707 |
| 2013/0050942 | A1* | 2/2013 | Konishi | H05K 7/20145 361/692 |
| 2013/0077254 | A1* | 3/2013 | Nguyen | G02B 6/4261 361/715 |
| 2013/0170142 | A1* | 7/2013 | Weaver, Jr. | H01L 23/427 361/701 |
| 2013/0329364 | A1* | 12/2013 | Kameno | H05K 7/20563 361/697 |
| 2014/0063748 | A1* | 3/2014 | Kraft | H01L 23/42 361/720 |
| 2014/0085564 | A1* | 3/2014 | Hendren | G02F 1/133308 349/58 |
| 2014/0160679 | A1* | 6/2014 | Kelty | H05K 7/20672 361/700 |
| 2015/0029658 | A1* | 1/2015 | Yairi | G06F 1/20 361/679.47 |
| 2015/0208550 | A1* | 7/2015 | Rugg | H05K 7/20472 361/713 |

* cited by examiner

HEAT DISSIPATION SYSTEM

RELATED APPLICATION

This application claims the benefit of U.S. Provisional Patent Application No. 61/768,009, filed on 22 Feb. 2013, and entitled "Heat Dissipation System", the entire disclosure of which is incorporated herein by reference.

TECHNICAL FIELD

This disclosure relates to heat dissipation systems and, more particularly, to heat dissipation systems configured to house a plurality of subcomponents.

BACKGROUND

Heat dissipation devices (such as heat sinks) have been used to cool heat producing devices (such as electronics). Unfortunately, the use of such heat dissipation devices requires the movement of air across the surface of the heat dissipation device to allow for cooling of the heat producing device to which it is attached. Accordingly, when devices are densely packaged and/or in shielded enclosures, the ability to pass air across the surface of the heat producing device may be greatly restricted. Accordingly, traditional cooling methods may become less effective.

SUMMARY OF DISCLOSURE

In one implementation, an electronic component includes a component enclosure. At least one subcomponent is positioned within the component enclosure. The at least one subcomponent is configured to be thermally coupled to the component enclosure.

One or more of the following features may be included. A thermal pad may be positioned between the at least one subcomponent and the component enclosure, wherein the thermal pad is configured to thermally couple the at least one subcomponent and the component enclosure. The component enclosure may include an upper surface and a lower surface. The at least one subcomponent may be thermally coupled to one of the upper surface and the lower surface of the component enclosure. The at least one subcomponent may be thermally coupled to both the upper surface and the lower surface of the component enclosure.

The at least one subcomponent may include a plurality of subcomponents. At least one of the plurality of subcomponents may be an RF shielded subcomponent. The plurality of subcomponents may be configured to be thermally coupled to each other. A thermal pad may be positioned between each of the plurality of subcomponents, wherein the thermal pad is configured to thermally couple each of the plurality of subcomponents. The component enclosure may be configured to dissipate heat. The electronic component may be an automated testing electronic component. A fan assembly may be configured to circulate cooling air throughout the component enclosure.

In another implementation, an electronic component includes a component enclosure. A plurality of subcomponents is positioned within the component enclosure. The plurality of subcomponents are configured to be thermally coupled to each other. The plurality of subcomponents are configured to be thermally coupled to the component enclosure.

One or more of the following features may be included. A thermal pad may be positioned between the plurality of subcomponents and the component enclosure, wherein the thermal pad is configured to thermally couple the plurality of subcomponents and the component enclosure. A thermal pad may be positioned between each of the plurality of subcomponents, wherein the thermal pad is configured to thermally couple each of the plurality of subcomponents. The component enclosure may include an upper surface and a lower surface. The plurality of subcomponents may be thermally coupled to one of the upper surface and the lower surface of the component enclosure. The plurality of subcomponents may be thermally coupled to both the upper surface and the lower surface of the component enclosure.

In another implementation, an electronic component includes a component enclosure. At least one subcomponent is positioned within the component enclosure. The at least one subcomponent includes an RF shielded subcomponent. A thermal pad is positioned between the at least one subcomponent and the component enclosure. The thermal pad is configured to thermally couple the at least one subcomponent and the component enclosure.

One or more of the following features may be included. The component enclosure may be configured to dissipate heat. The electronic component may be an automated testing electronic component. A fan assembly may be configured to circulate cooling air throughout the component enclosure.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION

Figure 1:
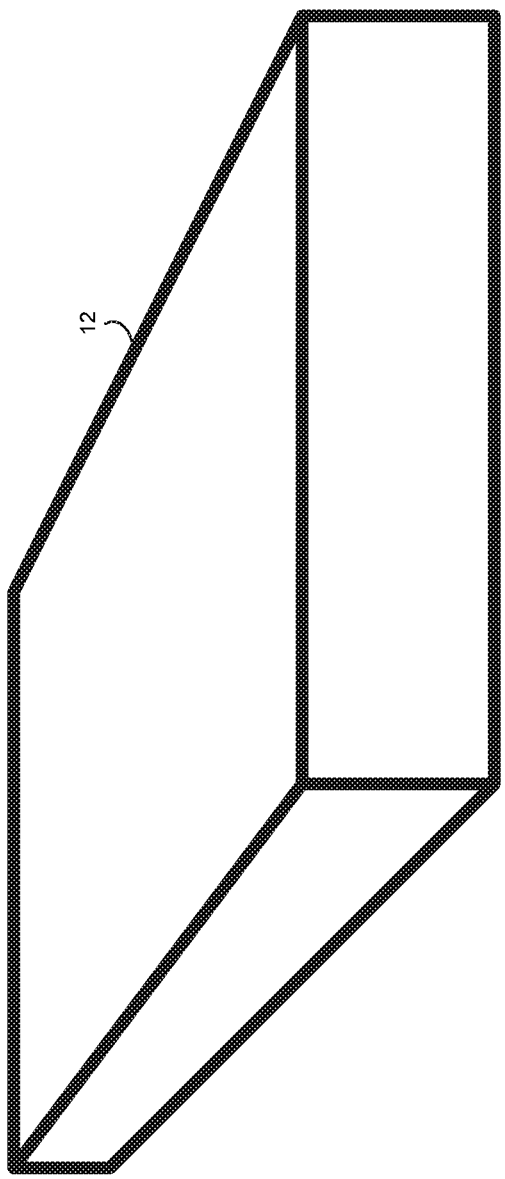
FIG. 1 is a perspective view of an electronic component that includes a heat dissipation system.
Figure 2:
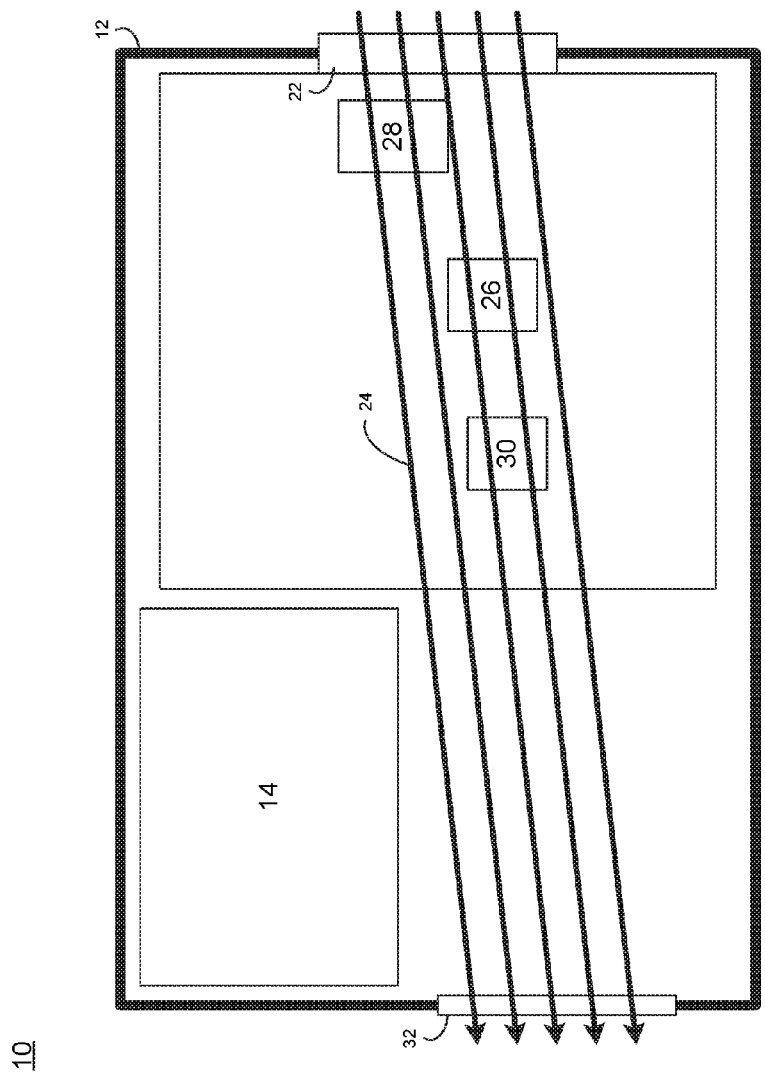
FIG. 2 is a top view of the electronic component of FIG. 1.
Figure 3:
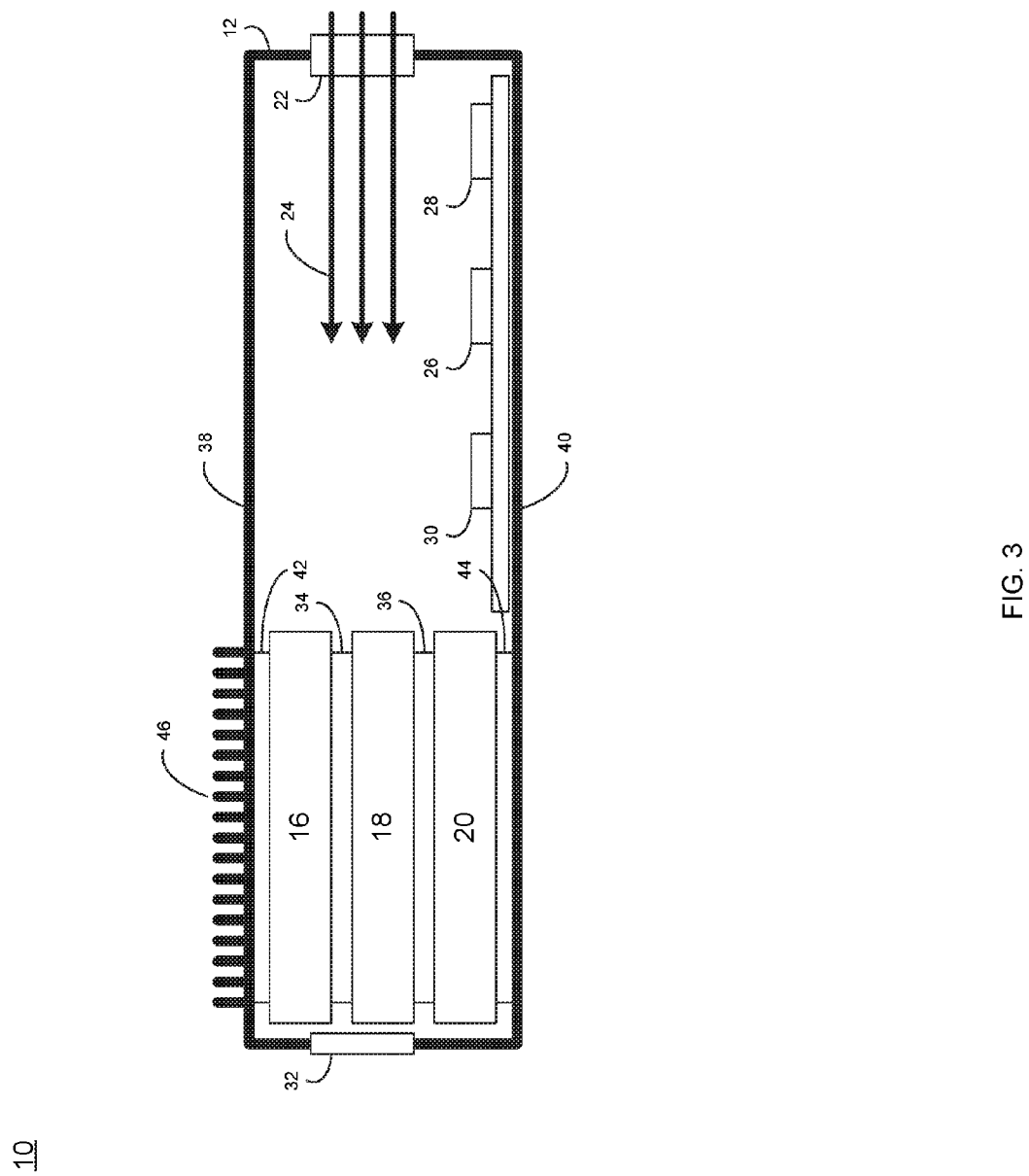
FIG. 3 is a side view of the electronic component of FIG. 1.

Referring to FIGS. 1-3, there is shown electronic component 10 that may include a component enclosure 12. Component enclosure 12 may be configured to house at least one subcomponent 14. For example, assume for illustrative purposes that a plurality of subcomponents (e.g., subcomponents 16, 18, 20) are positioned within component enclosure 12. Examples of subcomponents 16, 18, 20 may include but are not limited to: synthesizer subcomponents, modulation subcomponents, receiver subcomponents, processor subcomponents, digitizer subcomponents, power supply subcomponents, control subcomponents, digital signal processor subcomponents, filter subcomponents and storage subcomponents. While in this particular example, electronic component 10 is shown to include three subcomponents (e.g., subcomponents 16, 18, 20), this is for illustrative purposes only and is not intended to be a limitation of this disclosure, as other configurations are possible and are considered to be within the scope of this disclosure. An example of electronic component 10 may include but is not limited to an automated testing electronic component, such as one or more of the products produced by LTX-Credence of Norwood, MA.

As is known in the art, modulation subcomponents (e.g., an RF modulation assembly) may be RF shielded to prevent the RF signal generated by these modulation subcomponents from interfering with the operation of the other subcomponents. Alternatively/additionally, RF sensitive subcomponents that may be adversely impacted by RF signals and may be RF shielded to prevent extraneous RF signals generated by e.g., modulation subcomponents from interfering with the operation of these RF sensitive subcomponents. The manner in which these various subcomponents may be RF shielded may include encasing the subcomponent in a subenclosure through which RF signals cannot penetrate. While such subenclosures may prevent the transmissions and/or interference of RF signals, such subenclosures may further complicate the convective cooling of these subcomponents, as cooling air cannot directly contact the heat producing elements within these subcomponents.

Electronic component 10 may include fan assembly 22 that may be configured to circulate cooling air 24 throughout component enclosure 12. Accordingly, various components (e.g., components 26, 28, 30) within electronic component 10 may be positioned such that cooling air 24 passes over them and components 26, 28, 30 are convectively cooled, wherein cooling air 24 is exhausted from electronic component 10 via one or more exhaust passages (e.g., exhaust passage 32).

The plurality of subcomponents (e.g., subcomponents 16, 18, 20) that are positioned within component enclosure 12 may be positioned in a manner that does not allow for efficient convective cooling. Specifically, due to the size of component enclosure 12, the plurality of subcomponents (e.g., subcomponents 16, 18, 20) may need to be positioned too close to each other to allow cooling air 24 to circulate around the plurality of subcomponents (e.g., subcomponents 16, 18, 20).

Accordingly, the plurality of subcomponents (e.g., subcomponents 16, 18, 20) may be configured to be thermally coupled to each other. For example, a thermal pad (e.g., thermal pads 34, 36) may be positioned between each of the plurality of subcomponents (e.g., subcomponents 16, 18, 20), wherein thermal pads 34, 36 are configured to thermally couple each of the plurality of subcomponents. Specifically, thermal pad 34 may be configured to thermally couple subcomponent 16 and subcomponent 18, while thermal pad 36 may be configured to thermally couple subcomponent 18 and subcomponent 20.

As is known in the art, thermal pads 34, 36 may be preformed of a thermally conductive material (e.g., a paraffin or silicone based material), wherein thermal pads 34, 36 are utilized to thermally couple devices (e.g., subcomponents 16, 18, 20) so that thermal energy may be transferred between these devices. For example, thermal pads may be positioned between a heat generating device and a heat sink to aid in the conduction of thermal energy away from the heat generating device (e.g., a CPU) and into the heat sink (which is usually made of a thermally conductive material, such as aluminum or copper). Thermal pads 34, 36 may be used to fill air gaps caused by imperfectly flat/smooth surfaces on e.g., subcomponents 16, 18, 20, thus allowing for efficient transfer of thermal energy between subcomponents 16, 18, 20.

Additionally, one or more of subcomponents 16, 18, 20 may be configured to be thermally coupled to component enclosure 12. For example, component enclosure 12 may include upper surface 38 and lower surface 40. One or more thermal pads may be positioned between subcomponents 16, 18, 20 and component enclosure 12, wherein these thermal pads are configured to thermally couple subcomponents 16, 18, 20 and component enclosure 12. For example, thermal pad 42 may be configured to thermally couple subcomponents 16 to upper surface 38 of component enclosure 12; and thermal pad 44 may be configured to thermally couple subcomponent 20 to lower surface 40 of component enclosure 12. Thermal pads 42, 44 may be used to fill air gaps caused by imperfectly flat/smooth surfaces on e.g., subcomponents 16, 18, 20 and upper/lower surfaces 40, 42 of component enclosure 12, thus allowing for efficient transfer of thermal energy between subcomponents 16, 18, 20 and component enclosure 12.

Component enclosure 12 may be configured to dissipate heat (e.g., the thermal energy generated by subcomponents 16, 18, 20). For example, one or more surfaces of component enclosure 12 may include fins 46 to increase surface area and allow for enhanced heat dissipation of the thermal energy generated by subcomponents 16, 18, 20.

Having described the disclosure of the present application in detail and by reference to embodiments thereof, it will be apparent that modifications and variations are possible without departing from the scope of the disclosure defined in the appended claims.

What is claimed is:

1. An electronic component comprising:
   a component enclosure;
   at least one subcomponent positioned within the component enclosure;
   wherein the at least one subcomponent is configured to be thermally coupled to the component enclosure, wherein the at least one subcomponent includes a plurality of subcomponents, wherein at least a portion of a plurality of thermal pads are positioned between each of the plurality of subcomponents, wherein the thermal pads are configured to thermally couple each of the plurality of subcomponents, wherein at least one of the plurality of subcomponents is individually an electronic RF shielded subcomponent, wherein at least a first subcomponent of the plurality of subcomponents is configured to be thermally coupled to an upper surface of the component enclosure via a first thermal pad of the plurality of thermal pads, wherein at least a second subcomponent of the plurality of subcomponents is configured to be thermally coupled to a lower surface of the component enclosure via a second thermal pad of the plurality of thermal pads.

2. The electronic component of claim 1 wherein the component enclosure is configured to dissipate heat.

3. The electronic component of claim 1 wherein the electronic component is an automated testing electronic component.

4. The electronic component of claim 1 further comprising:
   a fan assembly configured to circulate cooling air throughout the component enclosure.

5. An electronic component comprising:
   a component enclosure;
   a plurality of subcomponents positioned within the component enclosure;
   wherein the plurality of subcomponents are configured to be thermally coupled to the plurality of subcomponents via at least a portion of a plurality of thermal pads positioned between each of the plurality of subcomponents, and wherein at least one of the plurality of subcomponents is individually an electronic RF shielded subcomponent;
   wherein the plurality of subcomponents are configured to be thermally coupled to the component enclosure, wherein at least a first subcomponent of the plurality of subcomponents is configured to be thermally coupled to an upper surface of the component enclosure via a first thermal pad of the plurality of thermal pads, wherein at least a second subcomponent of the plurality of subcomponents is configured to be thermally coupled to a lower surface of the component enclosure via a second thermal pad of the plurality of thermal pads.

6. An electronic component comprising:

a component enclosure;

a plurality of subcomponents positioned within the component enclosure, wherein at least one of the plurality of subcomponents includes an individual electronic RF shielded subcomponent; and a plurality of thermal pads configured to thermally couple the plurality of subcomponents and the component enclosure, wherein at least a portion of the plurality of thermal pads is positioned between each of the plurality of subcomponents, an upper surface of the component enclosure, and a lower surface of the component enclosure.

7. The electronic component of claim 6 wherein the component enclosure is configured to dissipate heat.

8. The electronic component of claim 6 wherein the electronic component is an automated testing electronic component.

9. The electronic component of claim 6 further comprising:

a fan assembly configured to circulate cooling air throughout the component enclosure.

* * * * *